United States Patent [19]

Nadd

[11] Patent Number: 5,672,992
[45] Date of Patent: Sep. 30, 1997

[54] CHARGE PUMP CIRCUIT FOR HIGH SIDE SWITCH

[75] Inventor: Bruno C. Nadd, Puyvert, France

[73] Assignee: International Rectifier Corporation, El Segundo, Calif.

[21] Appl. No.: 420,301

[22] Filed: Apr. 11, 1995

[51] Int. Cl.$^6$ .................................................. H03K 17/16
[52] U.S. Cl. ........................... 327/390; 327/391; 327/437; 327/537; 327/589
[58] Field of Search ............................... 327/108, 389, 327/390, 391, 427, 434, 437, 534, 536, 537, 589

[56] References Cited

U.S. PATENT DOCUMENTS

| | | | |
|---|---|---|---|
| 4,691,129 | 9/1987 | Einzinger et al. | |
| 4,703,196 | 10/1987 | Arakawa | 327/126 |
| 4,731,552 | 3/1988 | Miyamoto | 327/306 |
| 4,883,976 | 11/1989 | Deane | 327/536 |
| 4,902,919 | 2/1990 | Spohrer et al. | 327/108 |
| 4,952,827 | 8/1990 | Leipold et al. | |
| 5,023,474 | 6/1991 | Wilcox | 327/109 |
| 5,028,811 | 7/1991 | Le Roux et al. | 327/110 |
| 5,142,171 | 8/1992 | Nunogawa et al. | |
| 5,184,035 | 2/1993 | Sugibayashi | 327/536 |
| 5,258,662 | 11/1993 | Skovmand | 327/544 |
| 5,359,244 | 10/1994 | Hopkins | 327/434 |
| 5,369,320 | 11/1994 | Satani et al. | 327/108 |
| 5,371,418 | 12/1994 | Leipold et al. | 327/109 |
| 5,404,053 | 4/1995 | Poma et la. | 327/108 |
| 5,446,406 | 8/1995 | Gantioler et al. | 327/42 |
| 5,467,047 | 11/1995 | Robb | 327/377 |

FOREIGN PATENT DOCUMENTS

| | | |
|---|---|---|
| 0602708 | 6/1994 | European Pat. Off. |
| 4403201 | 8/1994 | Germany |

*Primary Examiner*—Terry Cunningham
*Attorney, Agent, or Firm*—Ostrolenk, Faber, Gerb & Soffen, LLP

[57] ABSTRACT

A high side monolithic switching circuit integrated into a silicon chip is described in which the charge pump is connected to the ground terminal by a constant current circuit and floats relative to the ground terminal to reduce noise generation. The charge pump is connected to a $V_{cc}$ terminal by an auxiliary power MOSFET having its gate connected to the charge pump output circuit. The conventional charge pump diodes are implemented as MOSFET devices which can be easily integrated into the common monolithic chip. A clamping circuit across the charge pump permits the use of a low voltage, small area capacitor for a high voltage device.

32 Claims, 9 Drawing Sheets

5,672,992

CHARGE PUMP CIRCUIT FOR HIGH SIDE SWITCH

BACKGROUND OF THE INVENTION

This invention relates to high side switches, and more particularly relates to a novel circuit for the charge pump of such circuits which has reduced noise, increased efficiency and is more easily integrated into a common semiconductor chip which includes the power device of the high side switch.

High side switches are well-known for numerous applications in which a load with a grounded terminal must be driven from a power supply and which includes a MOSgated power device having a gate terminal which requires a potential higher than that of the power supply to turn on the switch. A "charge pump" circuit is commonly provided to produce the higher voltage needed to turn on the MOS gate controlled ("MOSgated") power device when commanded to do so by an input signal. Such devices are commonly integrated circuit chips in which the power MOSgated device, charge pump and other control circuits are integrated in a common semiconductor chip.

Presently available high side drivers have several problems including the following:

Severe noise is generated in both the supply voltage and ground pins in many applications, due to the high frequency (1 mHz) charging and discharging of the voltage doubling capacitor in the charge pump.

The charge pump capacitor requires an excessively thick oxide and silicon area when integrated into a silicon chip for high supply voltage applications, for example, those greater than 12 volts.

The turn-off switch needed to disconnect the power MOSgated device from the charge pump in the device "off" condition is difficult to implement in an N channel chip embodiment where high voltage P channel control MOSFETs are not available.

The monolithic implementation of the voltage doubler diode in the charge pump is difficult, and it cannot be integrated as a simple P/N diode in the N⁻ epitaxial substrate of a conventional integrated circuit employing a self-isolated vertical conduction process.

The output voltage of the charge pump circuit is reduced by the diode forward voltage drops in the charge pump doubler circuit, which has a major effect in low voltage applications.

The present invention provides a novel charge pump circuit for high side switches which has low noise and high efficiency, and is more easily integratable in the same chip containing the power MOSgated device.

BRIEF DESCRIPTION OF THE INVENTION

In accordance with the present invention, a novel charge pump circuit is provided for a high side switch in which the charge pump is disconnected from the ground terminal of the integrated circuit and is connected instead to a floating node. The floating node is then connected to the integrated circuit ground by a constant current source. Therefore, the current from the source terminal pin is constant, thus reducing noise at the ground and source voltage pins.

Since the charge pump is connected to a floating node, it is possible to clamp the charge pump voltage to a low voltage, even though the output voltage of the device is higher. Therefore, the voltage across the charge pump capacitor is low, even for a high voltage device, and its size is limited.

As a further feature of the invention, a turn-off control switch connected between the charge pump input terminal and the supply source terminal is implemented as an N channel control MOSFET in an integrated circuit chip containing an N channel MOSgated power device section. The control N channel MOSFET is then connected to a positive feedback circuit to the charge pump. A novel starter circuit is employed to initially turn on the control N channel MOSFET.

As a still further feature of the invention, the voltage doubler diodes are implemented as synchronous rectifiers consisting of a MOSFET in place of one diode, and a resistor and MOSFET for the other diode. These components are easily integrated into the N⁻ epitaxial substrate of an integrated circuit containing an N channel MOSgated main power device.

Other features and advantages of the present invention will become apparent from the following description of the invention which refers to the accompanying drawings.

3

Figure 12:
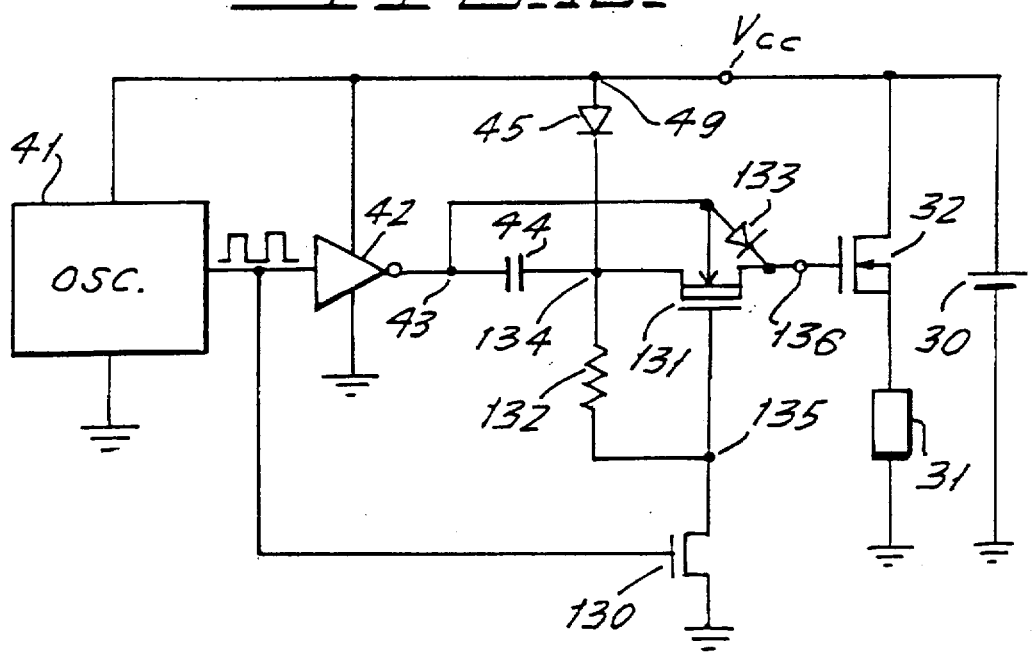
FIG. 12 shows the charge pump circuit of FIG. 2 in which the diode connected to the power MOSFET gate is replaced by a transistor and resistor which are easily integratable into a common silicon chip with the power MOSgated device.
Figure 13A:
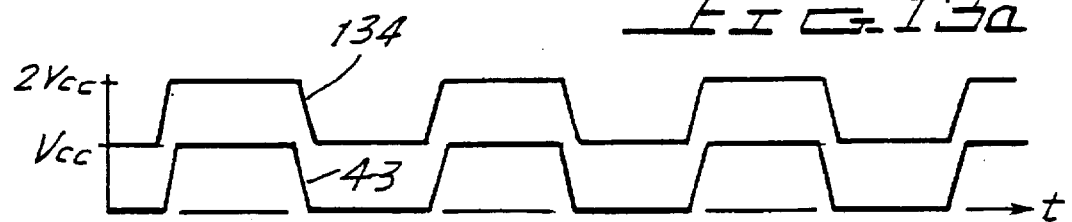
Figure 13B:
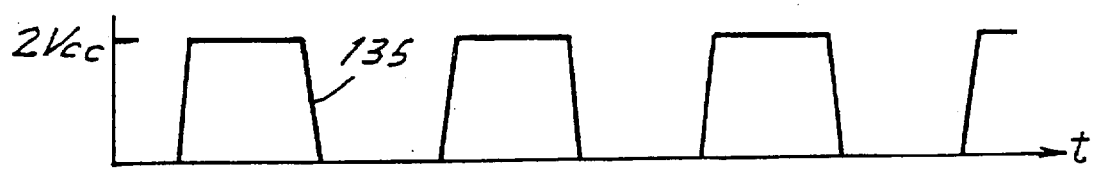
Figure 13C:
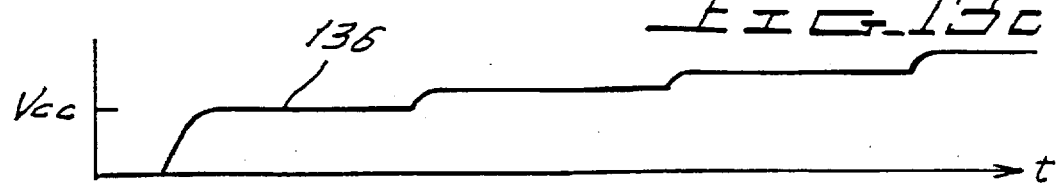

FIGS. 13a, 13b and 13c show the operation of the circuit of FIG. 12 on a common time base.

Figure 14:
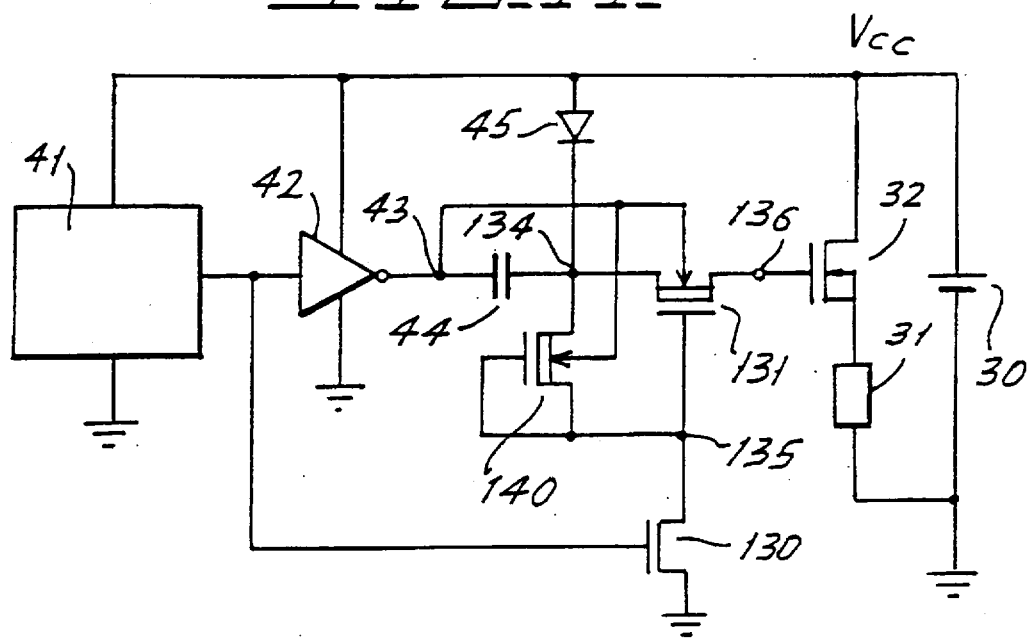

FIG. 14 shows the circuit of FIG. 12 in which the resistor of the resistor-transistor combination is replaced by a depletion mode transistor.

Figure 15:
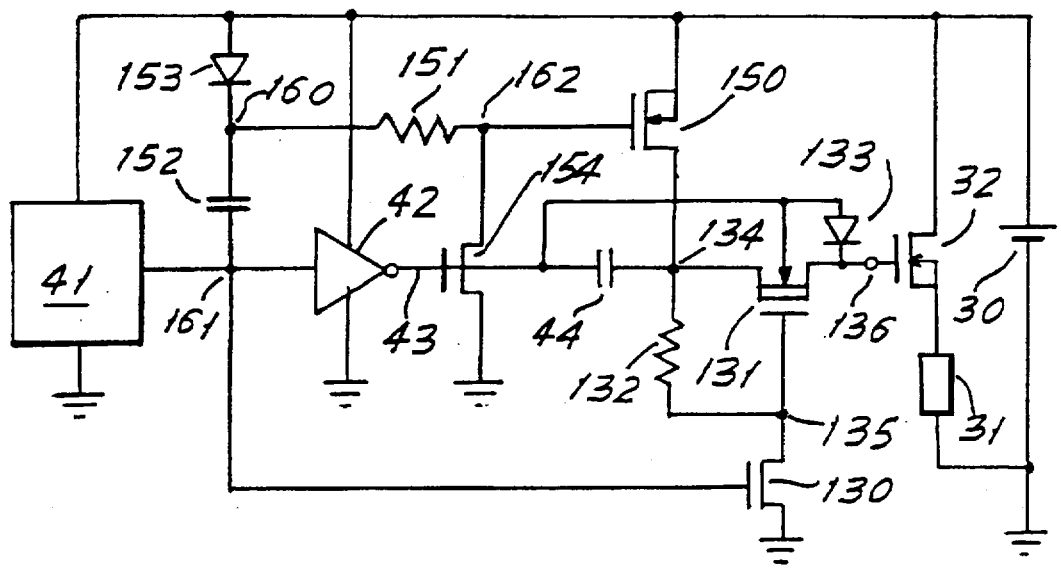

FIG. 15 shows an improvement of the circuit of FIG. 14 to permit the application of the full voltage of 2 $V_{cc}$ to the gate of the power device.

Figure 16A:
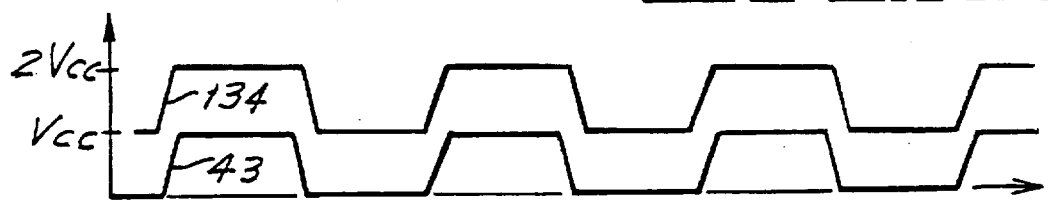
Figure 16B:
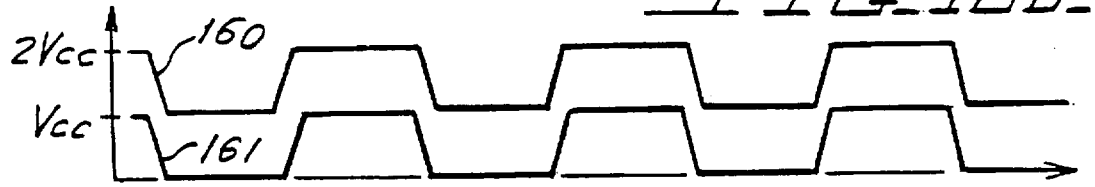
Figure 16C:
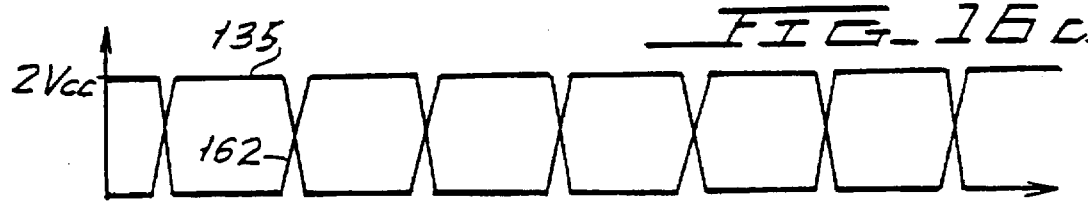

FIGS. 16a, 16b and 16c show waveforms which describe the operation of the circuit of FIG. 15.

Figure 17:
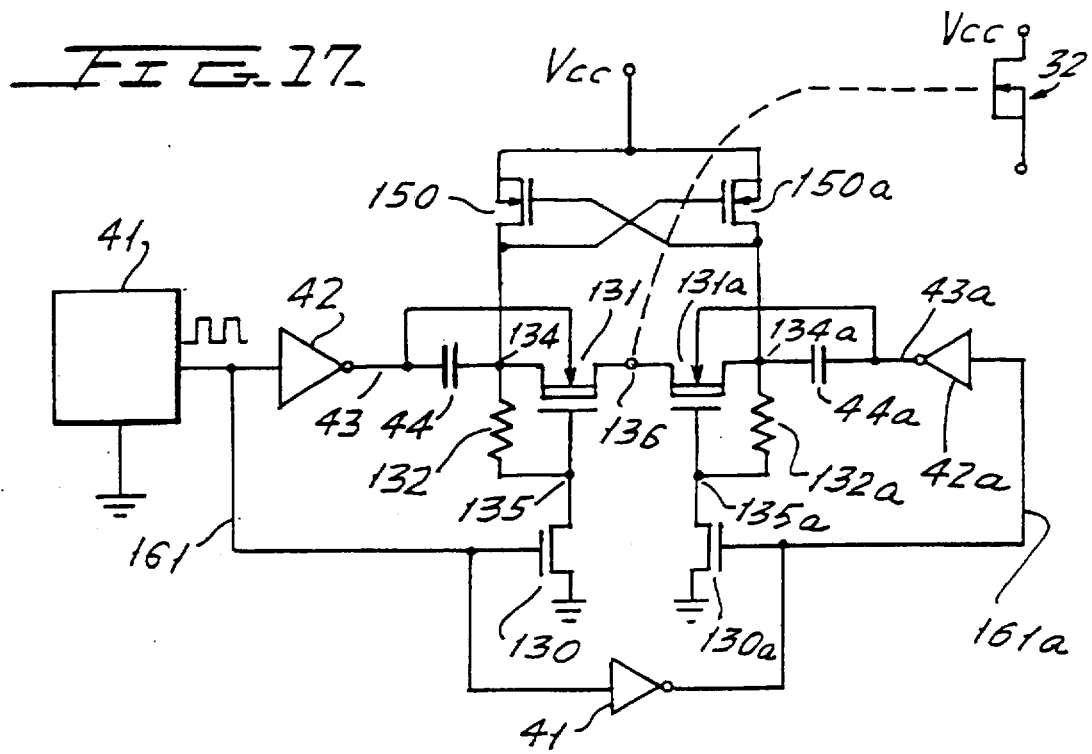
Figure 18A:
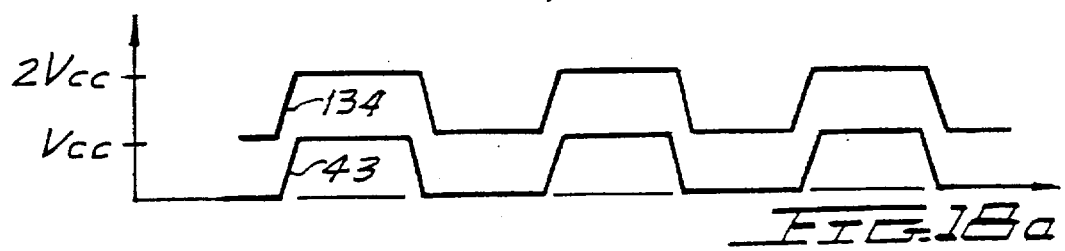
Figure 18B:
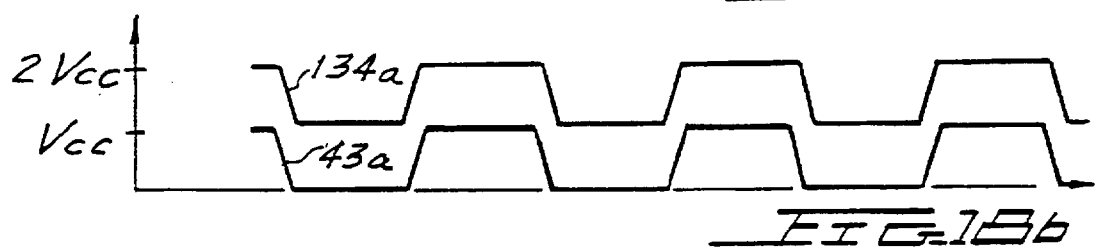
Figure 18C:
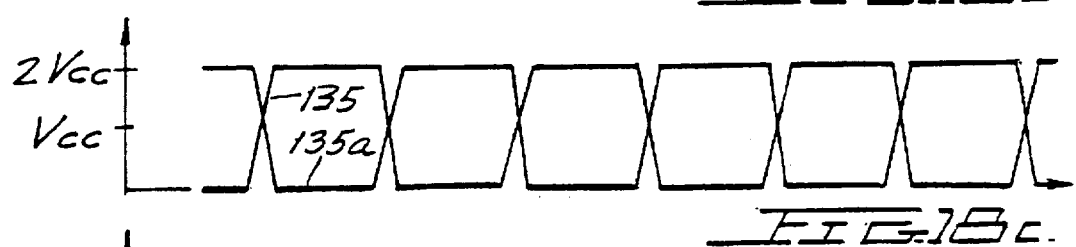
Figure 18D:
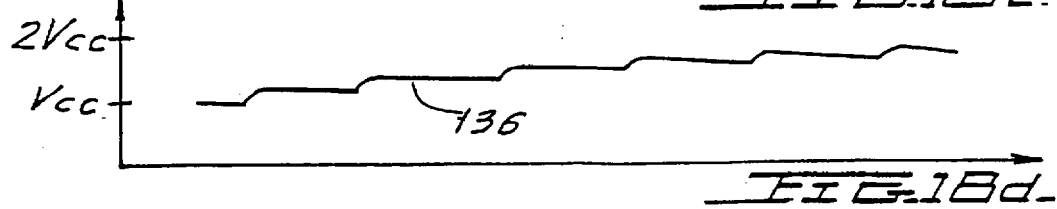

FIG. 17 shows the circuit of FIG. 15 with a push-pull implementation.

FIGS. 18a to 18d are waveforms on a common time base to explain the operation of the circuit of FIG. 17.

DETAILED DESCRIPTION OF THE DRAWINGS

Figure 1:
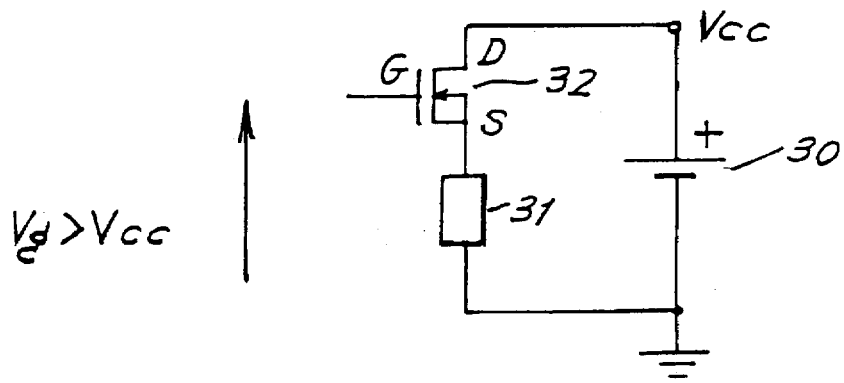
FIG. 1 is a circuit diagram of a known high side switch.

Referring first to FIG. 1, there is shown a typical prior art high side switching circuit. Such circuits are used in many applications, for example, automotive, in which it is necessary to drive a load having a grounded terminal. Thus, in FIG. 1, a battery 30 is connected to load 31 through an N channel power MOSFET 32. The negative terminal of battery 30 and one side of load 31 are connected to a common ground, for example, an automobile chassis. The positive terminal of battery 30 is at a voltage $V_{cc}$, which may be 12 volts. The power MOSFET 32 may be any other desired MOSgated device, such as an IGBT, or MOSgated thyristor or the like.

When MOSFET 32 is in the on state, its source is close to the power supply potential $V_{cc}$. In order to have a low drain-to-source voltage drop, it is necessary to bias the gate G of MOSFET 32 at a potential of 5 to 10 volts above the potential of source S, which is 5 to 10 volts above $V_{cc}$. In most cases, particularly where the high side switch is implemented as a stand-alone IC, no supply voltage above $V_{cc}$ is available in the system, and a voltage above $V_{cc}$ has to be generated on the chip. This is commonly done by a capacitive voltage multiplier, often called a charge pump.

Figure 2:
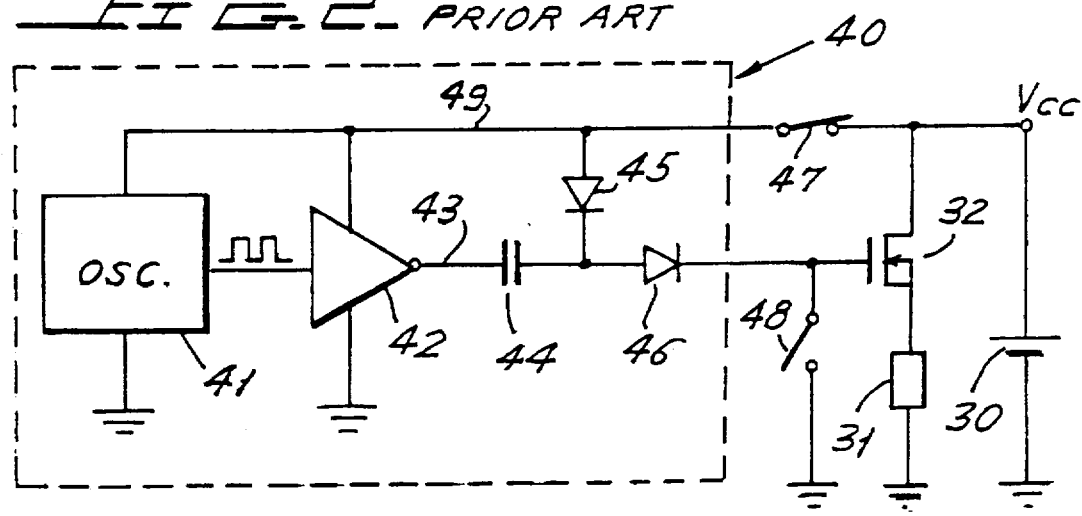
FIG. 2 shows a prior art charge pump circuit, formed as a voltage doubler, which is used for the circuit of FIG. 1 to provide gate drive for the MOSgated power device.

FIG. 2 shows a known voltage doubler circuit 40 commonly used in high side switches, connected to the high side switch of FIG. 1. The doubler circuit 40 employs a square wave oscillator circuit 41, the output of which is bufferized by buffer 42. The output node 43 of buffer 42 is connected to capacitor 44 which is connected to and charged through diode 45 from source $V_{cc}$. The node between capacitor 44 and diode 45 is connected to diode 46 which is, in turn, connected to the gate of MOSFET 32. Two switching devices, shown as switches 47 and 48, are provided in which switch 47 is operable to connect and disconnect node 49 from power supply 30 and switch 48 closes in the MOSFET 32 off state to pull the gate of MOSFET 32 to ground (or to the source of MOSFET 32).

Figure 3:
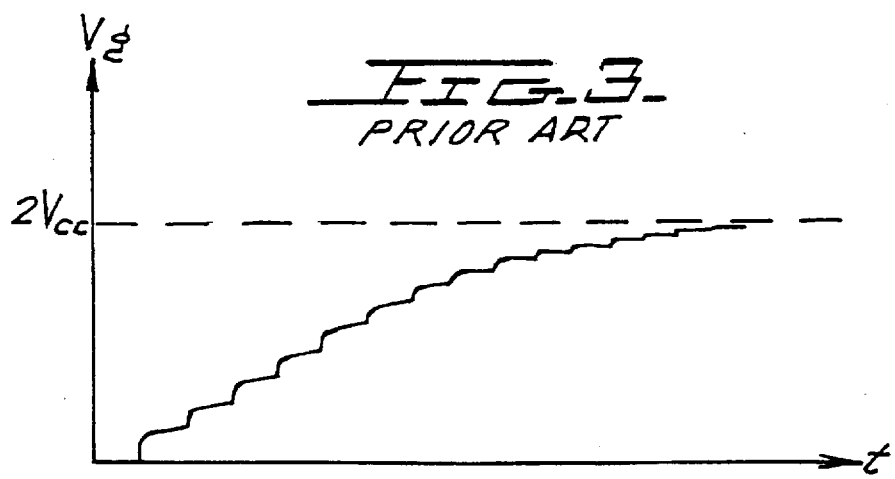
FIG. 3 shows the gate voltage provided to the MOSgated power device of FIG. 2 as a function of time.

The charge pump 40 operates as follows:

When node 43 at the output of buffer 42 is low, capacitor 44 is charged from $V_{cc}$ through diode 45. When the node 43 at the output of buffer 42 is high, the charge of capacitor 44 is transferred to the gate of MOSFET 32, through diode 46. The voltage on the gate of MOSFET 32 then increases in step fashion, as shown in FIG. 3, and the voltage at the gate of MOSFET 32 approaches 2 $V_{cc}$ to turn on MOSFET 32.

To turn off MOSFET 32, switch 48 closes to pull 10 the gate voltage to ground and switch 47 is opened to isolate node 49 from the power supply.

4

The circuit of FIG. 2 has the following drawbacks:
1. The charging and discharging of capacitor 44 at high frequency, typically 1 MHz, generates high frequency current in the $V_{cc}$ and ground pin nodes and related package pins of the IC 40, causing severe noise problems in many applications.
2. It is difficult to implement switch 47 into a single silicon chip for the entire circuit with most available processes, especially when no P channel MOSFETs are available.
3. It is difficult to extend the use of the circuit to applications with high $V_{cc}$ voltages because the full $V_{cc}$ is applied across capacitor 44. Therefore, to implement capacitor 44 in an integrated circuit for high voltage, prohibitively thick oxides and greater silicon area are required.

Figure 4:
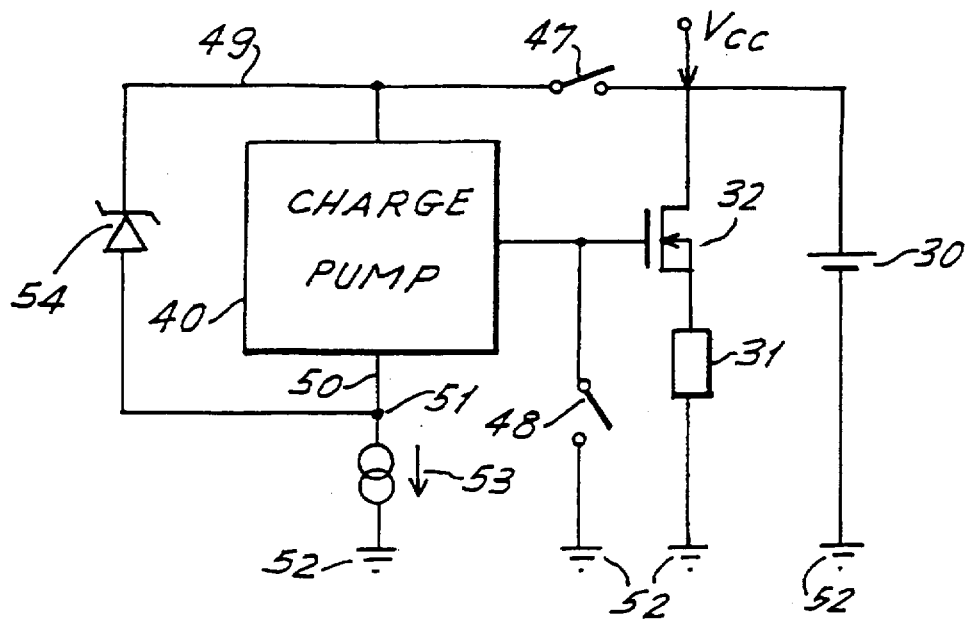
FIG. 4 shows the novel high side circuit of the invention in which any desired charge pump circuit is connected to a floating node.

FIG. 4 shows a first embodiment of the present invention, in which the circuit of FIG. 2 is modified by connecting the ground lead 50 of charge pump 40 (shown as a block in FIG. 4) to a floating node 51. The floating node 51 is then connected to ground 52 by a constant current source circuit 53. A voltage regulator, for example, a zener diode 54 connects nodes 49 and 51.

The charge pump 40 can be of any desired type, including, but not limited to that of FIG. 2. A significant feature of the circuit of FIG. 4 is that the charge pump 40 is connected to floating node 51 instead of the ground node 52. The current in the ground pins and $V_{cc}$ pins of the circuit will therefore be pure direct current, in view of the constant current source 53, so that the operation of charge pump 40 generates no noise at these pins.

Figure 4A:
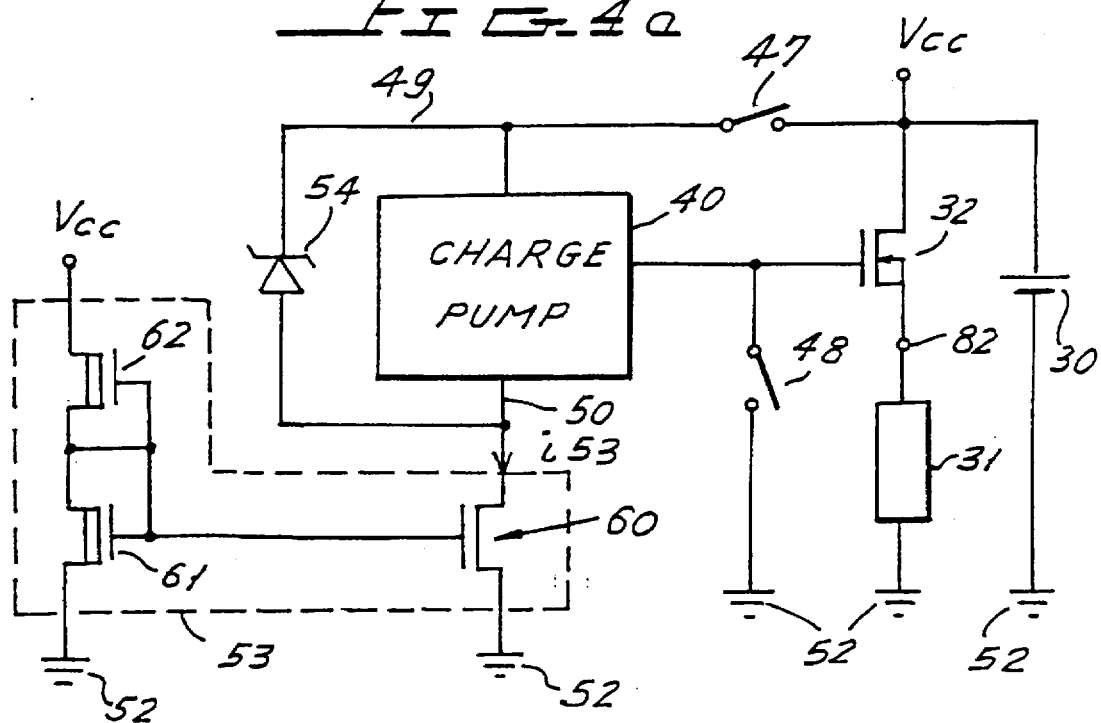
FIG. 4a shows the circuit of FIG. 4 with a preferred embodiment for a constant current circuit connecting the floating node of any desired charge pump circuit to the integrated circuit ground.

FIG. 4a shows the circuit of FIG. 4 with constant current source 53 implemented as MOSFET 60, the gate of which is driven by cascade control MOSFETs 61 and 62 which are enhancement and depletion mode MOSFETs respectively.

Figure 5A:
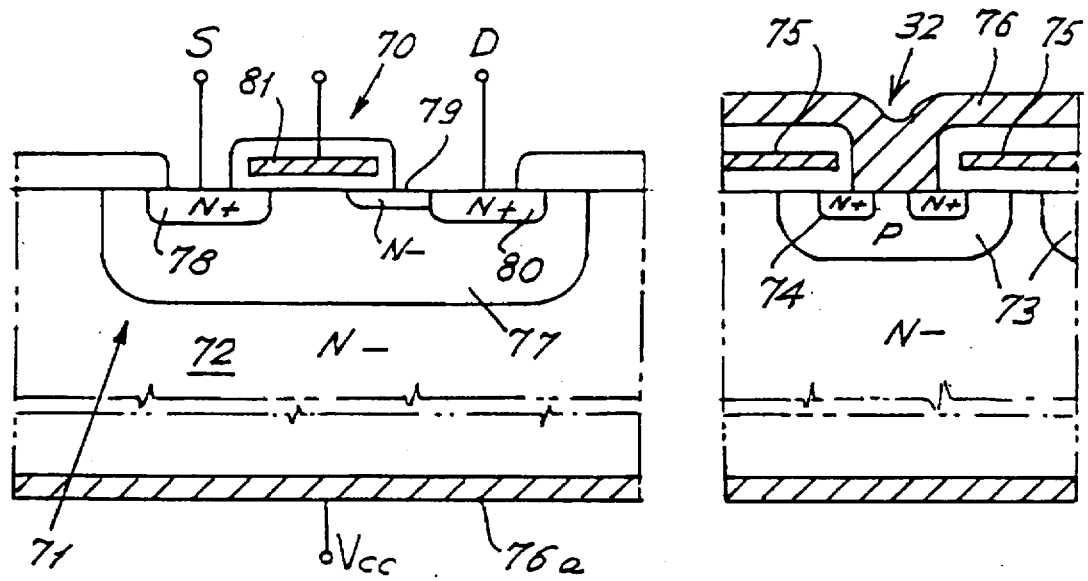
FIG. 5a shows a preferred implementation in silicon of an added transistor in the constant current circuit of FIG. 5 to enable the device to withstand high voltage.
Figure 5:
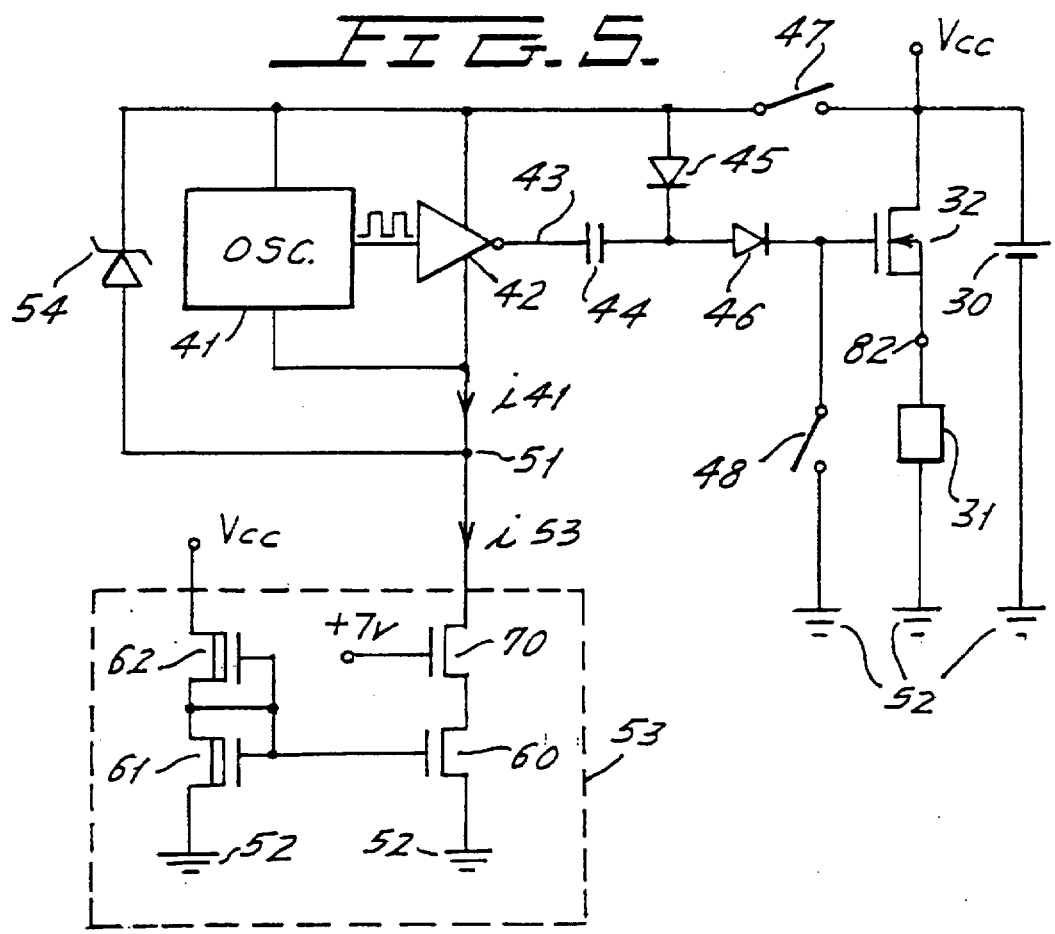
FIG. 5 shows the circuit of FIG. 4 with the charge pump of FIG. 2, and with a modified constant current circuit embodiment.

FIG. 5 shows the circuit of FIG. 4, using the charge pump of FIG. 2 and a modified constant current source. More specifically, the current source in FIG. 5 includes an added N channel MOSFET 70 which is easily integrated, as will be later described.

Figure 6:
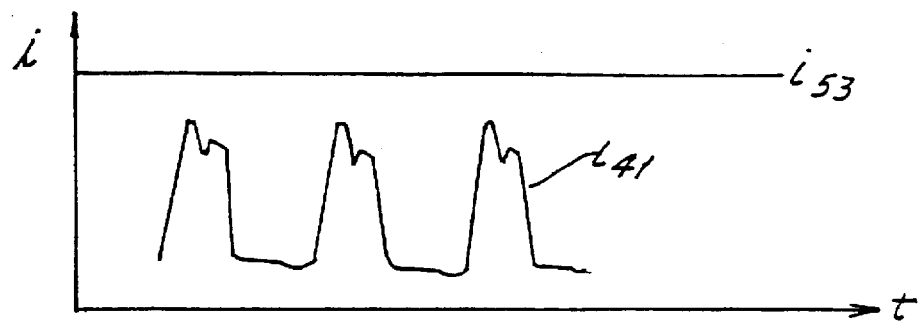
FIG. 6 shows the current of the constant current circuit, superimposed on the charge pump output current for the circuit of FIG. 5 to demonstrate the reduced noise level at the power and ground pins of the circuit.

In the circuit of FIGS. 4, 4a and 5, the supply voltage $V_{cc}$ is greater than the knee voltage of zener diode 54. If the current is 3 in the constant current circuit 53 is greater than the current $i_{41}$ of charge pump 41 then, as shown in FIG. 6, the current in the ground and $V_{cc}$ pins (or terminals) of the IC circuit will be a pure direct current. Therefore, the high frequency current of the charge pump generates zero or very low noise. Presently available high side switches, such as the IR6000, made by International Rectifier Corporation, and the BTS410E made by Siemens have peak-to-peak $V_{cc}$/ground currents in excess of 0.1 milliampere. Circuits employing the floating node 53 of FIGS. 4, 4a and 5 have a noise of 20 microamperes peak-to-peak which is hardly discernable from background noise.

A further advantage of the circuits of FIGS. 4, 4a and 5 is that the voltage across capacitor 44 is limited to the zener voltage ($V_{cc}-V_{51}$) where $V_{51}$ is the voltage at node 51. Therefore, a high voltage charge pump circuit can be built with low voltage capacitors with thin oxides and smaller die area without sacrificing reliability. By way of example, the circuit of FIG. 5 may operate with a $V_{cc}$ of up to 60 volts while the voltage applied to the charge pump capacitor is limited to 7 volts.

As previously mentioned, the constant current circuit 53 in FIG. 5 contains an added MOSFET 70. MOSFET 70 is a relatively high voltage MOSFET to be used in high voltage applications to remove high voltage from MOSFET 60. A fixed gate voltage, for example, 7 volts, is applied to the gate of MOSFET 70 and it is easily integrated into the common chip which contains all other circuit elements of FIG. 5.

The implementation of MOSFET 70 as a lightly doped drain MOSFET is shown in FIG. 5a which is a cross-section of a portion of the chip. Thus, the chip 71 has a lightly doped $N^-$ substrate 72 which receives all of the junctions which make up the circuit. The power section of the chip which defines the power MOSFET 32 consists of any desired junction pattern and can be a vertical conduction device having a plurality of spaced P base diffusions 73 which contain respective sources, such as $N^+$ source 74. The channel regions of each of bases 73 are covered by a MOSgate 75 which may be a polysilicon gate. The gate 75 is conventionally insulated from source electrode 76 which contacts each of the bases 73 and their respective sources 74. A drain electrode 76a is formed on the bottom of chip 72 and is connected to $V_{cc}$.

P-wells, such as P-well 77, are also diffused into the same chip to contain control circuits for the main power device. FIG. 5a shows one such P-well 77 which contains MOSFET 70. Thus, MOSFET 70 is an N channel device comprising an $N^+$ source diffusion 78, an $N^-$ drain diffusion 79 and an $N^+$ drain contact diffusion 80. Its polysilicon gate 81 extends across the P channel region between diffusions 78 and 79. Thus, the MOSFET 70 is easily formed in chip 71, using many of the same process steps which form the power section 32.

The chip 71 is conventionally housed after its completion and externally available terminal pins extend through the housing to the various electrodes of the device. Thus, a $V_{cc}$ terminal pin will be connected to the drain electrode 76a and a source terminal pin will be connected to the source electrode at node 82 in FIGS. 4a and 5. A ground terminal pin will also be connected to the ground nodes in the chip 71 which are shown in the circuit of FIGS. 4a and 5.

Figure 7:
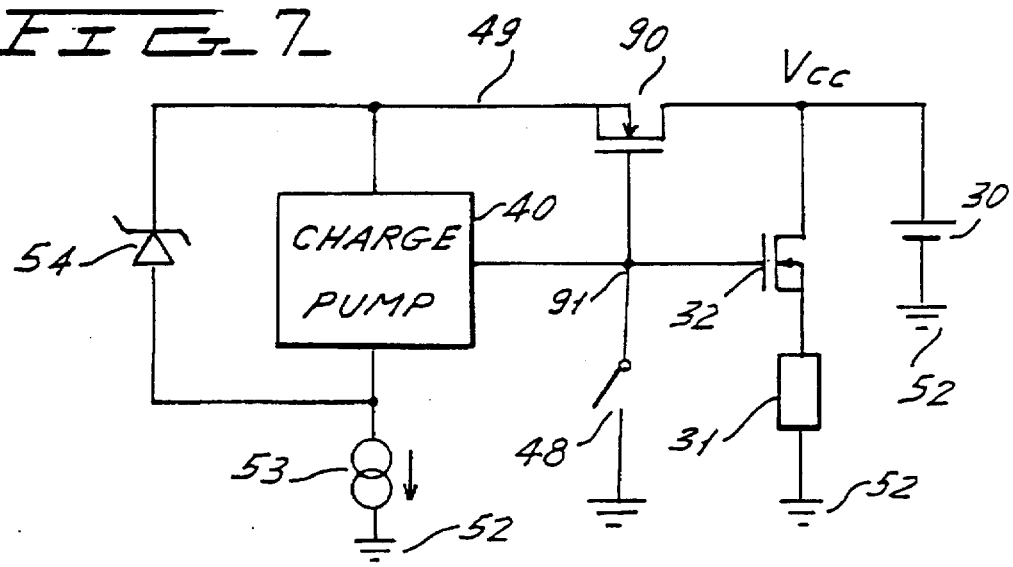
FIG. 7 shows the circuit of FIG. 4, modified to employ an auxiliary MOSFET to implement the off switch, schematically shown in FIGS. 4 and 5.

FIG. 7 shows the circuit of FIG. 4 with the switch 47 implemented as an auxiliary N channel power MOSFET 90 which can easily be integrated into the IC chip 71 of FIG. 5a with any conventional power MOSFET process since MOSFETs 32 and 90 have a common drain.

Switch 48 in FIG. 7 is implemented as a lateral NMOS transistor with a lightly doped drain, similar to MOSFET 70.

During steady state operation of the circuit of FIG. 7, charge pump 40 provides a voltage at node 91 which is connected to the gate of power MOSFET 90 which is 5 to 10 volts above $V_{cc}$. MOSFET 90 is thus turned fully on and the charge pump 40 receives power from $V_{cc}$.

Figure 8:
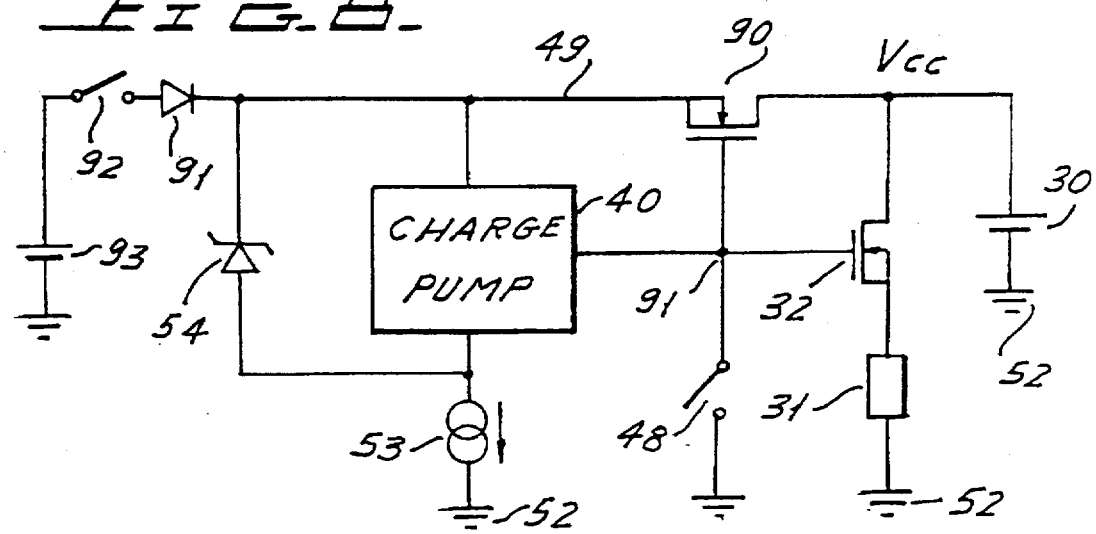
FIG. 8 shows the circuit of FIG. 5 which is modified to contain the auxiliary power MOSFET of FIG. 7 and a novel start-up circuit.

In order to turn on the circuit of FIG. 7, a start-up circuit is needed, as shown in FIG. 8, to initially pull up node 49 to start the charge pumping action. Thus, in FIG. 8, a start up circuit consisting of diode 91, switch 92 and voltage source 93 are provided. Voltage source 93 has a low voltage which may be derived from $V_{cc}$. Switch 92 may be implemented as a low voltage transistor.

In operation of the circuit of FIG. 8, at turn on, switch 92 closes to provide an initial voltage to charge pump 40. The charge pump 40 will then begin to supply itself from $V_{cc}$ through transistor 90 which is turned on and the circuit will operate as previously described.

Figure 9:
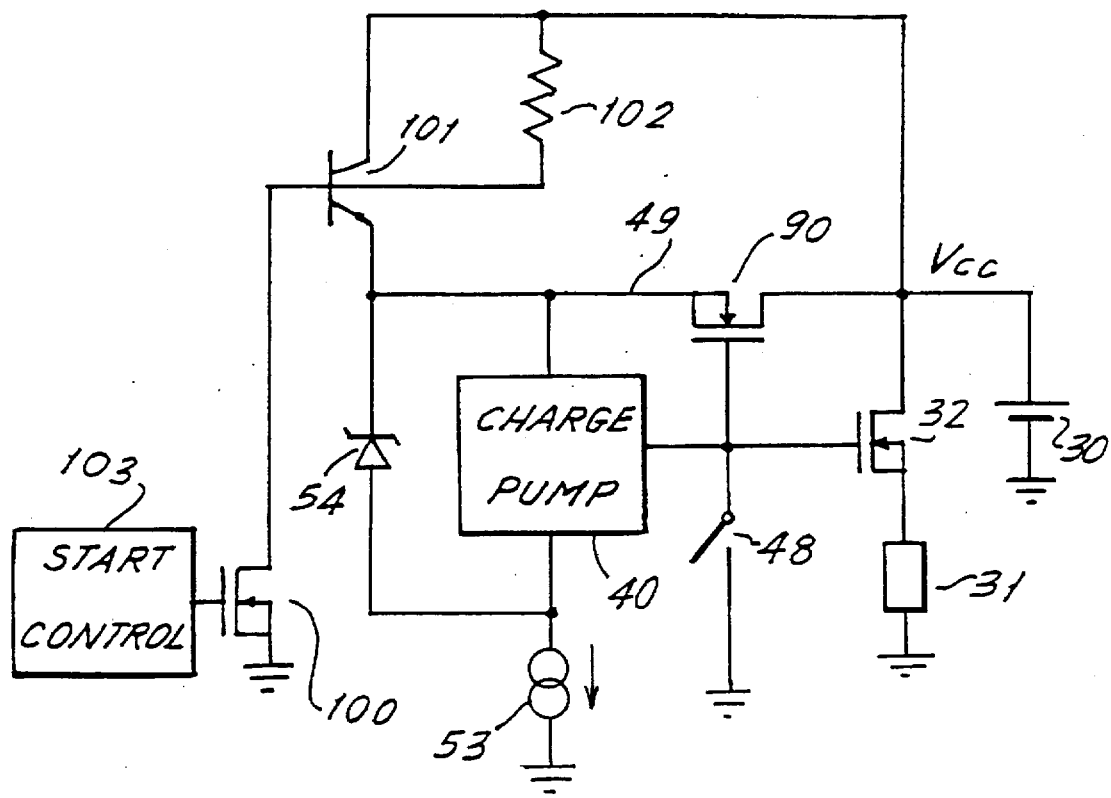
FIG. 9 shows the circuit of FIG. 8 with a modified start-up circuit.

FIG. 9 shows another embodiment of the start-up circuit of FIG. 8 and employs transistors 100 and 101 and resistor 102. In operation of the circuit of FIG. 9, at turn-on, the gate of transistor 100 is pulled to ground by start control circuit 103. The base of bipolar transistor 101 is pulled up by resistor 102 which is implemented as a depletion mode transistor which has a high resistance value equivalent to about 1 megohm. Thus, node 49 is pulled up to ($V_{cc}$–0.6) volts, starting the charge pump 40 operation.

Figure 10:
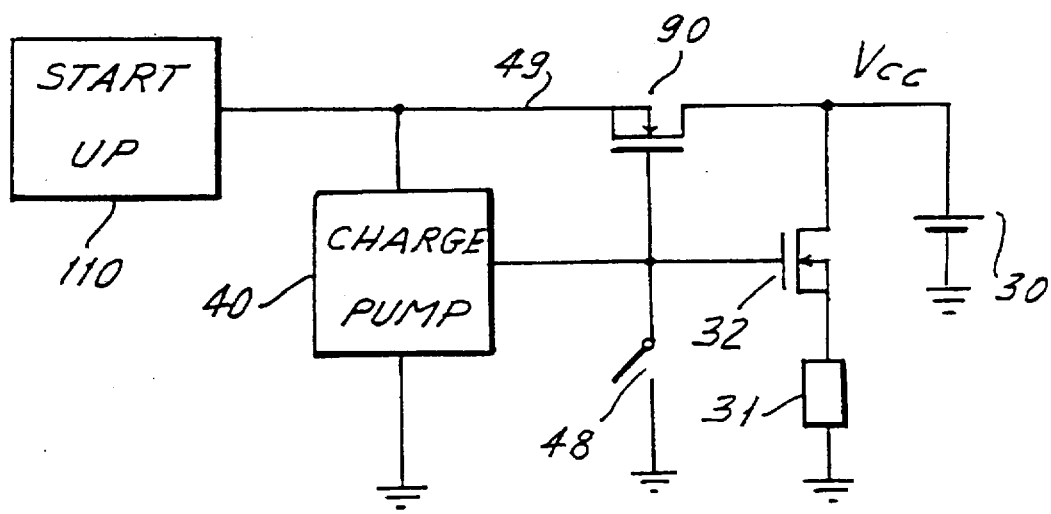
FIG. 10 is a block diagram of a high side circuit, which employs the novel auxiliary MOSFET of FIGS. 7, 8 and 9, in combination with a novel start-up circuit and a known type of grounded charge pump.

The novel auxiliary MOSFET 90 and any desired start-up circuit 110 can be used with the circuit of FIG. 2 in which the charge pump 40 is referenced to ground, as well as with the novel charge pump circuit with a floating node as in FIG. 4. FIG. 10 is a block diagram of such a circuit.

Figure 11:
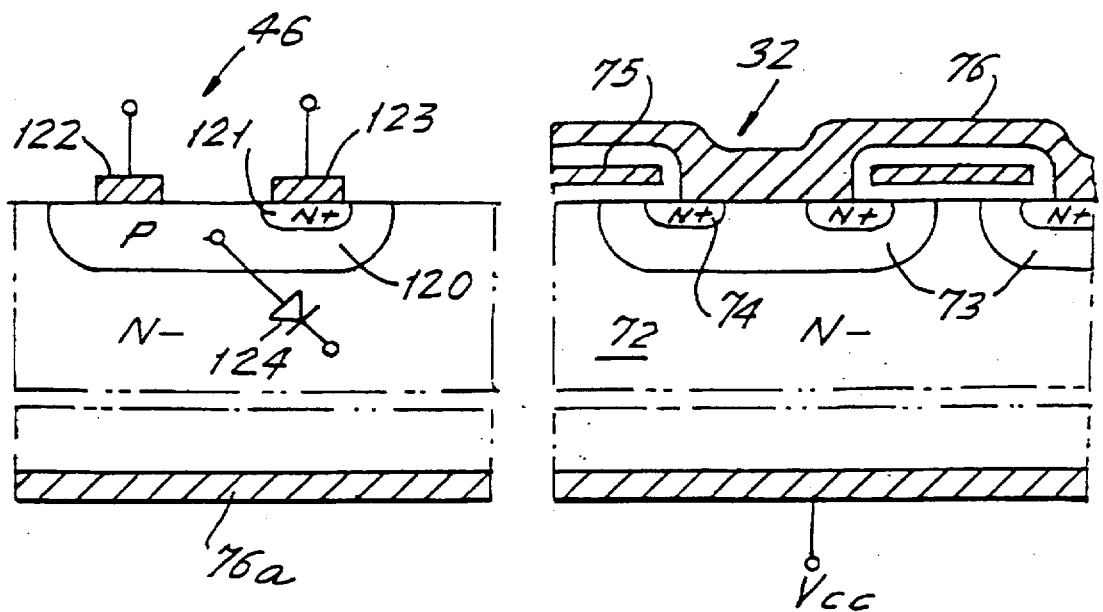
FIG. 11 is a cross-section of a portion of an integrated circuit chip which contains a charge pump diode connected to the main device gate to show the problems of its integration into the chip.

The charge pump circuit of the preceding figures employs diode 46 in the charging circuit. It is difficult and sometimes impossible to integrate this diode into a monolithic integrated circuit. FIG. 11 shows an attempt to integrate diode 46 into the P-well 120 in the $N^-$ substrate 72 of FIG. 5a. Diode 46 is formed by $N^+$ diffusion 121 in well 120. Electrodes 122 and 123 are connected to regions 120 and 121 respectively to form the electrodes of the diode 46. Since the epitaxial substrate 72 is the drain of power MOSFET 32, and is connected to $V_{cc}$, diode 46 cannot be integrated as a simple PN diode because its anode has to be able to float several volts above $V_{cc}$. However, this is impossible because of the parasitic diode 124 between the anode of diode 46 and $V_{cc}$. A simple integration of diode 46 is therefore impossible.

Another drawback of the diodes 45 and 46 in the charge pump of FIG. 2 is that they reduce the output voltage of the charge pump 40 by their forward voltage drops to (2 $V_{cc}$–2 $V_f$) (where 2 $V_f$ is the forward voltage drop of diodes 45 and 46). This can be a substantial reduction for low $V_{cc}$ applications such as laptop computers or automotive applications.

FIG. 12 shows a modified charge pump circuit in which diode 46 is replaced by more easily integratable components and with a reduced forward voltage drop in the output of the charge pump circuit. Thus, diode 46 is replaced by enhancement mode transistor 130, depletion mode transistor 131, resistor 132, and a substrate diode 133 of transistor 131. These components are easily integrated into the substrate 72 of FIG. 11.

The operation of the circuit of FIG. 12 is described as follows, in connection with FIGS. 13a, 13b and 13c which show the voltages at nodes 134–43, 135, and 136 respectively. Thus, the first time the output of buffer 42 at node 43 goes high, the node 136 at the gate of MOSFET 32 charges up to ($V_{cc}$–$V_f$), through the substrate diode 133 of depletion mode transistor 131. When the output at node 43 goes low, capacitor 44 charges up through diode 45. During this period, transistor 131 is in its off state; its source at node 134 and its drain at node 136 being at ($V_{cc}$–$V_f$) while its gate at node 135 and its substrate are at 0 volts. Thus, transistor 131 is off and the gate of power MOSFET 32 is isolated from the remainder of the circuit.

When node 43 goes high, node 134 rises to (2 $V_{cc}$–$V_f$). Transistor 130 then turns off, enabling the gate of transistor 131 to reach the potential of its source through resistor 132. Since transistor 131 is a depletion mode device, it turns on with 0 volts between gate and source. Therefore, the charge on capacitor 44 will transfer to the gate of MOSFET 32 through transistor 131.

This process continues each cycle until the node 136 potential shown in FIG. 13c reaches the limit of (2 $V_{cc}$–$V_f$). Note that this limit is higher than that of the prior art circuit of FIG. 2 by one diode drop $V_f$ because there is only one diode in the current path. Furthermore, transistors 130, 131 and resistor 132 may be easily integrated into the IC because the substrate of transistor 131 never exceeds $V_{cc}$.

FIG. 14 shows an embodiment of the circuit of FIG. 12 in which resistor 132 of FIG. 12 is replaced by a depletion mode MOSFET 140 which is easily integrated into the IC substrate.

FIG. 15 shows a modification of the circuit of FIG. 12 which even further reduces the voltage drop of the output of the charge pump at the gate of MOSFET 32 and eliminates all diode drops. Thus, transistor 150, resistor 151, capacitor 152, diode 153 and transistor 154 are added to the circuit of FIG. 15 to avoid the drop produced by diode 45 in FIG. 12. Note that MOSFET 150 replaces diode 45 of the circuit of FIG. 12.

The operation of the circuit of FIG. 15 is best understood from the curves of FIGS. 16a, 16b and 16c. The potentials at nodes 134-43, 160-161 and 135-162 respectively in FIG. 15 are shown in FIGS. 16a, 16b and 16c. The first time the output at node 43 goes high, the gate of power MOSFET 32 at node 136 charges to ($V_{cc}-V_f$) through the substrate diode 133 of depletion mode transistor 131. At the same time, node 161 is low and capacitor 152 is charged up to ($V_{cc}-V_f$) through diode 153.

When node 161 goes high, node 43 goes low. Since capacitor 152 is already charged to ($V_{cc}-V_f$), node 160 will be boosted to (2 $V_{cc}-V_f$). Since transistor 154 is off, node 162 will also be boosted to (2 $V_{cc}-V_f$) and transistor 150 will be fully "on." Capacitor 44 will then charge up to $V_{cc}$ through transistor 150. For the same reasons described in connection with the circuit of FIG. 12, transistor 131 will be off during this time and the gate of MOSFET 32 is isolated from the circuit.

When node 43 next goes high, transistor 154 turns on and node 162 falls to 0 volts, turning off transistor 150, allowing node 134 to rise to 2 $V_{cc}$. For the same reasons as in FIG. 12, transistor 131 turns on and the charge on capacitor 44 will transfer through the transistor 131 to the gate of MOSFET 32.

The same process repeats each cycle until the voltage at node 136 reaches 2 $V_{cc}$. Thus, the voltage at node 136 is 2 Vf higher than that of the charge pump of FIG. 2 because there is no diode in the current path.

FIG. 17 shows the basic circuit of FIG. 8 implemented as a push-pull circuit. The two halves of the circuit are symmetric, the left-hand side of the circuit using the same numerals as in FIG. 8 and the right-hand side of the circuit using the same numerals with the suffix "a". Only a portion of the high side switch is shown, particularly the power MOSFET 32 having its gate connected to node 136 as shown by the dotted-line connection.

The operation of the circuit of FIG. 17 is best understood by reference to FIGS. 18a, 18b, 18c and 18d which show the voltages at nodes 134-43, 134a-43a, 135-135a and 136 in FIG. 17 respectively. It will be seen in FIGS. 18a, 18b and 18c that the potentials at nodes 134, 43 and 135 are in opposite phase to the potentials at nodes 134a, 43a and 135a respectively.

When node 43 is low, node 43a is at $V_{cc}$ and node 134a is at 2 $V_{cc}$. Therefore, transistor 150 is fully "on" and capacitor 44 is charged up to $V_{cc}$ through transistor 150. During this period, transistor 130 is "on" so that transistor 131 is "off." Similarly, transistor 130a is "off" so that transistor 131a is "on" and the charge of capacitor 44a is transferred to the node 136 and the gate of power MOSFET 32.

Node 43 then goes to $V_{cc}$, and node 134 is boosted to 2 $V_{cc}$. This turns transistor 150a fully "on," which turns "off" transistor 150 and prevents the discharge of capacitor 44 through transistor 150. Since transistor 150a is "on" and node 43a is low, capacitor 44a will be charged up to $V_{cc}$ through transistor 150a. During this period, transistor 130a is "on" so transistor 131a is "off." Similarly, transistor 130 is "off" so transistor 131 is "on" and the charge of capacitor 44 is transferred to the gate of power MOSFET 32.

The same process takes place at each clock half cycle until the voltage on the gate of MOSFET 32 reaches the limit of 2 $V_{cc}$. As in the circuit of FIG. 12, the output voltage of the charge pump is unaffected by any diode drop because there is no diode in the current path.

Note that the circuit of FIG. 17 doubles the apparent frequency of the charge pump and thus reduces the ripple at node 136 by a factor of 2.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A high side switch circuit comprising, in combination: a gate controlled MOS power semiconductor device having first and second power electrodes and a control electrode; a charge pump circuit having first and second power terminals and an output terminal; a constant current source circuit having input and output terminals; a $V_{cc}$ input voltage terminal connected to said first power electrode of said gate controlled MOS power semiconductor device and connectable to a source of power; a load terminal connected to said second power electrode of said gate controlled MOS power semiconductor device and connectable to a grounded load that is capable of being energized from said source of power when said gate controlled MOS power semiconductor device is closed; and a ground terminal connectable to said grounded load; said charge pump circuit being operable to produce an output voltage at its said output terminal which is higher than said $V_{cc}$ input voltage; said first power terminal of said charge pump circuit being connected with said $V_{cc}$ input voltage terminal; said second power terminal of said charge pump circuit connected to said input terminal of said constant current circuit; said output terminal of said constant current circuit connected to said ground terminal, whereby said second power terminal has a floating potential and the currents at said $V_{cc}$ input voltage terminal and at said ground terminal are constant so that noise at said $V_{cc}$ input terminal and at said ground terminal is reduced; said output terminal of said charge pump circuit being connected to said control electrode of said gate controlled MOS power semiconductor device for providing, in conjunction with said constant current source sinking current from said charge pump, a voltage sufficiently higher than the voltage of said second terminal to turn on said gate controlled MOS power semiconductor device.

2. The circuit of claim 1 wherein said gate controlled MOS power semiconductor device is a power MOSFET.

3. The circuit of claim 1 which further includes voltage clamp means connected between said first and second power terminals of said charge pump circuit to limit the voltage therebetween.

4. The circuit of claim 3 wherein said voltage clamp means comprises a zener diode.

5. The circuit of claim 1 wherein said charge pump circuit comprises, in combination: a square wave oscillator connected to and operated from said first and second power terminals of said charge pump circuit and having an oscillator output terminal, an inverter buffer connected to said oscillator output terminal, a charge storage capacitor, a first diode and a second diode; said inverter buffer having an output connected in series with said capacitor and said first diode to said control electrode of said gate controlled MOS power device; said second diode connected from said $V_{cc}$ input voltage terminal to the node between said capacitor and said first diode whereby, when the output of said inverter buffer is low, said capacitor is charged from the voltage at said $V_{cc}$ terminal and through said second diode and, when said output of said inverter buffer is high, the voltage of said capacitor plus the voltage of said $V_{cc}$ terminal are applied in series through said first diode to said control terminal of said gate controlled MOS power device.

6. The circuit of claim 5 which further includes voltage clamp means connected between said first and second power terminals of said charge pump circuit to limit the voltage therebetween.

7. The circuit of claim 6 wherein said voltage clamp means comprises a zener diode.

8. The circuit of claim 3 wherein said charge pump circuit comprises, in combination: a square wave oscillator connected to and operated from said first and second power terminals of said charge pump circuit and having an oscillator output terminal, an inverter buffer connected to said oscillator output terminal, a charge storage capacitor, a first diode and a second diode; said inverter buffer having an output connected in series with said capacitor and said first diode to said control electrode of said gate controlled MOS power device; said second diode connected from said $V_{cc}$ input voltage terminal to the node between said capacitor and said first diode whereby, when the output of said inverter buffer is low, said capacitor is charged from the voltage at said $V_{cc}$ terminal and through said second diode and, when said output of said inverter buffer is high, the voltage of said capacitor plus the voltage of said $V_{cc}$ terminal are applied in series through said first diode to said control terminal of said gate controlled MOS power device.

9. The circuit of claim 1 wherein said gate controlled MOS power semiconductor device, said charge pump circuit, and said current source are integrated into a monolithic semiconductor chip.

10. The circuit of claim 1 wherein said charge pump circuit comprises, in combination, a square wave oscillator connected to and operated from said first and second power terminals of said charge pump circuit, an oscillator output terminal, an inverter buffer connected to said oscillator output terminal, and a charge storage capacitor; said inverter buffer having an output connected to said capacitor; a first coupling circuit means coupling said capacitor to said control electrode of said gate controlled MOS power semiconductor device; a second coupling circuit means for coupling said $V_{cc}$ input voltage terminal to the node between said capacitor and said first coupling circuit means whereby, when the output of said inverter buffer is low, said capacitor is charged from the voltage at said $V_{cc}$ terminal and through said second coupling means and, when said output of said inverter buffer is high, the voltage of said capacitor plus the voltage of said $V_{cc}$ terminal are applied in series through said first coupling means to said control terminal of said gate controlled MOS power semiconductor device.

11. A high side switch circuit comprising, in combination: a gate controlled MOS power semiconductor device having first and second power electrodes and a control electrode; a charge pump circuit having first and second power terminals and an output terminal; a constant current source circuit having input and output terminals; a $V_{cc}$ input voltage terminal connected to said first power electrode of said gate controlled MOS power semiconductor device and connectable to a source of power; a load terminal connected to said second power electrode of said gate controlled MOS power semiconductor device and connectable to a grounded load that is capable of being energized from said source of power when said gate controlled MOS power semiconductor device is closed; a ground terminal connectable to said grounded load; said charge pump circuit being operable to produce an output voltage at its said output terminal which is higher than said $V_{cc}$ input voltage; said first power terminal of said charge pump circuit being connected with said $V_{cc}$ input voltage terminal; said second power terminal of said charge pump circuit connected to said input terminal of said constant current circuit; said output terminal of said constant current circuit connected to said ground terminal, whereby said second power terminal has a floating potential and the currents at said $V_{cc}$ input voltage terminal and at said ground terminal are constant so that noise at said $V_{cc}$ input terminal and at said ground terminal is reduced; said output terminal of said charge pump circuit being connected to said control electrode of said gate controlled MOS power semiconductor device for providing a voltage sufficiently higher than the voltage of said second terminal to turn on said gate controlled MOS power semiconductor device; and first switching means operable to connect and disconnect said charge pump first power terminal to said $V_{cc}$ input voltage terminal and second switching means for connecting and disconnecting said control electrode of said gate controlled MOS power device to said ground terminal when said first switching means disconnects and connects said pump first power terminal to said $V_{cc}$ input terminal respectively.

12. The circuit of claim 11 wherein said gate controlled MOS power semiconductor device, said charge pump circuit, said first switching means and said current source are integrated into a monolithic semiconductor chip.

13. The circuit of claim 11 wherein said gate controlled MOS power semiconductor device, said charge pump circuit, said voltage clamp means and said current source are integrated into a monolithic semiconductor chip.

14. A high side switch circuit comprising, in combination: a gate controlled MOS power semiconductor device having first and second power electrodes and a control electrode; a charge pump circuit having first and second power terminals and an output terminal; a constant current source circuit having input and output terminals; a $V_{cc}$ input voltage terminal connected to said first power electrode of said gate controlled MOS power semiconductor device and connectable to a source of power; a load terminal connected to said second power electrode of said gate controlled MOS power semiconductor device and connectable to a grounded load that is capable of being energized from said source of power when said gate controlled MOS power semiconductor device is closed; a ground terminal connectable to said grounded load; said charge pump circuit being operable to produce an output voltage at its said output terminal which is higher than said $V_{cc}$ input voltage; said first power terminal of said charge pump circuit being connected with said $V_{cc}$ input voltage terminal; said second power terminal of said charge pump circuit connected to said input terminal of said constant current circuit; said output terminal of said constant current circuit connected to said ground terminal, whereby said second power terminal has a floating potential and the currents at said $V_{cc}$ input voltage terminal and at said ground terminal are constant so that noise at said $V_{cc}$ input terminal and at said ground terminal is reduced; said output terminal of said charge pump circuit being connected to said control electrode of said gate controlled MOS power semiconductor device for providing a voltage sufficiently higher than the voltage of said second terminal to turn on said gate controlled MOS power semiconductor device; voltage clamp means connected between said first and second power terminals of said charge pump circuit to limit the voltage therebetween; and first switching means operable to connect and disconnect said charge pump first power terminal to said $V_{cc}$ input voltage terminal and second switching means for connecting and disconnecting said control electrode of said gate controlled MOS power device to said ground terminal when said first switching means disconnects and connects said pump first power terminal to said $V_{cc}$ input terminal respectively.

15. A high side switch circuit comprising, in combination: a gate controlled MOS power semiconductor device having first and second power electrodes and a control electrode; a charge pump circuit having first and second power terminals and an output terminal; a constant current source circuit having input and output terminals; a $V_{cc}$ input voltage terminal connected to said first power electrode of said gate controlled MOS power semiconductor device and connectable to a source of power; a load terminal connected to said second power electrode of said gate controlled MOS power semiconductor device and connect and connectable to a grounded load that is capable of being energized from said source of power when said gate controlled MOS power semiconductor device is closed; a ground terminal connectable to said grounded load; said charge pump circuit being operable to produce an output voltage at its said output terminal which is higher than said $V_{cc}$ input voltage; said first power terminal of said charge pump circuit being connected with said $V_{cc}$ input voltage terminal; said second power terminal of said charge pump circuit connected to said input terminal of said constant current circuit; said output terminal of said constant current circuit connected to said ground terminal, whereby said second power terminal has a floating potential and the currents at said $V_{cc}$ input voltage terminal and at said ground terminal are constant so that noise at said $V_{cc}$ input terminal and at said ground terminal is reduced; said output terminal of said charge pump circuit being connected to said control electrode of said gate controlled MOS power semiconductor device for providing a voltage sufficiently higher than the voltage of said second terminal to turn on said gate controlled MOS power semiconductor device; and first switching means operable to connect and disconnect said charge pump first power terminal to said $V_{cc}$ input voltage terminal and second switching means for connecting and disconnecting said control electrode of said gate controlled MOS power device to said ground terminal when said first switching means disconnects and connects said pump first power terminal to said $V_{cc}$ input terminal respectively; wherein said charge pump circuit comprises, in combination: a square wave oscillator connected to and operated from said first and second power terminals of said charge pump circuit and having an oscillator output terminal, an inverter buffer connected to said oscillator output terminal, a charge storage capacitor, a first diode and a second diode; said inverter buffer having an output connected in series with said capacitor and said first diode to said control electrode of said gate controlled MOS power device; said second diode connected from said $V_{cc}$ input voltage terminal to the node between said capacitor and said first diode whereby, when the output of said inverter buffer is low, said capacitor is charged from the voltage at said $V_{cc}$ terminal and through said second diode and, when said output of said inverter buffer is high, the voltage of said capacitor plus the voltage of said $V_{cc}$ terminal are applied in series through said first diode to said control terminal of said gate controlled MOS power device.

16. A high side switch circuit comprising, in combination: a gate controlled MOS power semiconductor device having first and second power electrodes and a control electrode; a charge pump circuit having first and second power terminals and an output terminal; a constant current source circuit having input and output terminals; a $V_{cc}$ input voltage terminal connected to said first power electrode of said gate controlled MOS power semiconductor device and connectable to a source of power; a load terminal connected to said second power electrode of said gate controlled MOS power semiconductor device and connectable to a grounded load that is capable of being energized from said source of power when said gate controlled MOS power semiconductor device is closed; and a ground terminal connectable to said grounded load; said charge pump circuit being operable to produce an output voltage at its said output terminal which is higher than said $V_{cc}$ input voltage; said first power terminal of said charge pump circuit being connected with said $V_{cc}$ input voltage terminal; said second power terminal of said charge pump circuit connected to said input terminal of said constant current circuit; said output terminal of said constant current circuit connected to said ground terminal, whereby said second power terminal has a floating potential and the currents at said $V_{cc}$ input voltage terminal and at said ground terminal are constant so that noise at said $V_{cc}$ input terminal and at said ground terminal is reduced; said output terminal of said charge pump circuit being connected to said control electrode of said gate controlled MOS power semiconductor device for providing a voltage sufficiently higher than the voltage of said second terminal to turn on said gate controlled MOS power semiconductor device; and wherein said constant current circuit comprises a first control MOSFET having drain and source electrodes connected to said second power terminal of said charge pump circuit and said ground terminal respectively and a cascaded enhancement mode MOSFET and depletion mode MOSFET connected between an auxiliary voltage source and said ground terminal; the node between said enhancement mode and depletion mode MOSFETs connected to their respective gates and to the gate of said first control MOSFET.

17. The circuit of claim 16 which further includes a second control MOSFET in combination with said first MOSFET to increase the voltage between said second power terminal of said charge pump circuit and said ground terminal without breakdown of said first control MOSFET.

18. The circuit of claim 16 which further includes voltage clamp means connected between said first and second power terminals of said charge pump circuit to limit the voltage therebetween.

19. The circuit of claim 17 which further includes voltage clamp means connected between said first and second power terminals of said charge pump circuit to limit the voltage therebetween.

20. The circuit of claim 18 wherein said voltage clamp means comprises a zener diode.

21. The circuit of claim 19 wherein said voltage clamp means comprises a zener diode.

22. The circuit of claim 17 wherein said charge pump circuit comprises, in combination: a square wave oscillator connected to and operated from said first and second power terminals of said charge pump circuit and having an oscillator output terminal, an inverter buffer connected to said oscillator output terminal, a charge storage capacitor, a first diode and a second diode; said inverter buffer having an output connected in series with said capacitor and said first diode to said control electrode of said gate controlled MOS power device; said second diode connected from said $V_{cc}$ input voltage terminal to the node between said capacitor and said first diode whereby, when the output of said inverter buffer is low, said capacitor is charged from the voltage at said $V_{cc}$ terminal and through said second diode and, when said output of said inverter buffer is high, the voltage of said capacitor plus the voltage of said $V_{cc}$ terminal are applied in series through said first diode to said control terminal of said gate controlled MOS power device.

23. A high side switch circuit comprising, in combination: a gate controlled MOS power semiconductor device having first and second power electrodes and a control electrode; a charge pump circuit having first and second power terminals and an output terminal; a constant current source circuit having input and output terminals; a $V_{cc}$ input voltage terminal connected to said first power electrode of said gate controlled MOS power semiconductor device and connectable to a source of power; a load terminal connected to said second power electrode of said gate controlled MOS power semiconductor device and connectable to a grounded load that is capable of being energized from said source of power when said gate controlled MOS power semiconductor device is closed; a ground terminal connectable to said grounded load; said charge pump circuit being operable to produce an output voltage at its said output terminal which is higher than said $V_{cc}$ input voltage; said first power terminal of said charge pump circuit being connected with said $V_{cc}$ input voltage terminal; said second power terminal of said charge pump circuit connected to said input terminal of said constant current circuit; said output terminal of said constant current circuit connected to said ground terminal, whereby said second power terminal has a floating potential and the currents at said $V_{cc}$ input voltage terminal and at said ground terminal are constant so that noise at said $V_{cc}$ input terminal and at said ground terminal is reduced; said output terminal of said charge pump circuit being connected to said control electrode of said gate controlled MOS power semiconductor device for providing a voltage sufficiently higher than the voltage of said second terminal to turn on said gate controlled MOS power semiconductor device; add an auxiliary power MOSFET having first and second power terminals and a gate terminal; said first and second power terminals of said auxiliary power MOSFET connected to said first power terminal of said charge pump circuit and said $V_{cc}$ input voltage terminal respectively; said gate terminal of said auxiliary power MOSFET connected to said control electrode-of said gate controlled MOS power semiconductor device.

24. The circuit of claim 23 which further includes starter circuit means coupled between a auxiliary supply voltage source and said charge pump circuit for starting said charge pump circuit before said auxiliary power MOSFET conducts.

25. The circuit of claim 23 wherein said gate controlled MOS power semiconductor device, said charge pump circuit, said auxiliary power MOSFET and said current source are integrated into a monolithic semiconductor chip.

26. A high side switch circuit comprising, in combination: a gate controlled MOS power semiconductor device having first and second power electrodes and a control electrode; a charge pump circuit having first and second power terminals and an output terminal; a $V_{cc}$ input voltage terminal connected to said first power electrode of said gate controlled MOS power semiconductor device and connectable to a source of power; a load terminal connected to said second power electrode of said gate controlled MOS power semiconductor device and connectable to a grounded load which, when said grounded load is connected to said load terminal and said $V_{cc}$ input is connected to said source of power, is energized from said source of power when said gate controlled MOS power semiconductor device is closed; and a ground terminal connectable to said grounded load; said charge pump circuit being operable to produce an output voltage at its said output terminal which is higher than said $V_{cc}$ input voltage; said second power terminal of said charge pump circuit connected to said ground terminal, whereby said output terminal of said charge pump circuit is connected to said control electrode of said gate controlled MOS power semiconductor device for providing a voltage sufficiently higher than the voltage of said second terminal to turn on said gate controlled MOS power semiconductor device; a grounding switch connected to said control electrode of said MOS gated power device for grounding said control electrode when said grounding switch is closed; and an auxiliary power MOSFET having first and second power terminals and a gate terminal; said first and second power terminals of said auxiliary power MOSFET connected to said first power terminal of said charge pump circuit and said $V_{cc}$ input voltage terminal respectively; said gate terminal of said auxiliary power MOSFET connected to said control electrode of said gate controlled MOS power semiconductor device so that when said grounding switch is closed, said gate terminal of said auxiliary power MOSFET is grounded, thereby turning off said auxiliary power MOSFET to entirely electrically isolate said charge pump circuit from said supply voltage.

27. A high side switch circuit comprising, in combination: a gate controlled MOS power semiconductor device having first and second power electrodes and a control electrode; a charge pump circuit having first and second power terminals and an output terminal; a $V_{cc}$ input voltage terminal connected to said first power electrode of said gate controlled MOS power semiconductor device and connectable to a source of power; a load terminal connected to said second power electrode of said gate controlled MOS power semiconductor device and connectable to a grounded load which, when said grounded load is connected to said load terminal and said $V_{cc}$ input is connected to said source of power, is energized from said source of power when said gate controlled MOS power semiconductor device is closed; and a ground terminal connectable to said grounded load; said charge pump circuit being operable to produce an output voltage at its said output terminal which is higher than said $V_{cc}$ input voltage; said second power terminal of said charge pump circuit connected to said ground terminal, whereby said output terminal of said charge pump circuit is connected to said control electrode of said gate controlled MOS power semiconductor device for providing a voltage sufficiently higher than the voltage of said second terminal to turn on said gate controlled MOS power semiconductor device; a grounding switch connected to said control electrode of said MOS gated power device for grounding said control electrode when said grounding switch is closed; an auxiliary power MOSFET having first and second power terminals and a gate terminal; said first and second power terminals of said auxiliary power MOSFET connected to said first power terminal of said charge pump circuit and said $V_{cc}$ input voltage terminal respectively; said gate terminal of said auxiliary power MOSFET connected to said control electrode of said gate controlled MOS power semiconductor device so that when said grounding switch is closed, said gate terminal of said auxiliary power MOSFET is grounded, thereby turning off said auxiliary power MOSFET to electrically isolate said charge pump circuit from said supply voltage; and starter circuit means coupled between an auxiliary supply voltage source and said charge pump circuit for starting said charge pump circuit before said auxiliary power MOSFET conducts.

28. A high side switch circuit comprising, in combination: a gate controlled MOS power semiconductor device having first and second power electrodes and a control electrode; a charge pump circuit having first and second power terminals and an output terminal; a constant current source circuit having input and output terminals; a $V_{cc}$ input voltage terminal connected to said first power electrode of said gate controlled MOS power semiconductor device and connectable to a source of power; a load terminal connected to said second power electrode of said gate controlled MOS power semiconductor device and connectable to a grounded load that is capable of being energized from said source of power when said gate controlled MOS power semiconductor device is closed; a ground terminal connectable to said grounded load; said charge pump circuit being operable to produce an output voltage at its said output terminal which is higher than said $V_{cc}$ input voltage; said first power terminal of said charge pump circuit being connected with said $V_{cc}$ input voltage terminal; said second power terminal of said charge pump circuit connected to said input terminal of said constant current circuit; said output terminal of said constant current circuit connected to said ground terminal, whereby said second power terminal has a floating potential and the currents at said $V_{cc}$ input voltage terminal and at said ground terminal are constant so that noise at said $V_{cc}$ input terminal and at said ground terminal is reduced; said output terminal of said charge pump circuit being connected to said control electrode of said gate controlled MOS power semiconductor device for providing a voltage sufficiently higher than the voltage of said second terminal to turn on said gate controlled MOS power semiconductor device: wherein said charge pump circuit comprises, in combination, a square wave oscillator connected to and operated from said first and second power terminals of said charge pump circuit, an oscillator output terminal, an inverter buffer connected to said oscillator output terminal, and a charge storage capacitor; said inverter buffer having an output connected to said capacitor; a first coupling circuit means coupling said capacitor to said control electrode of said gate controlled MOS power semiconductor device; a second coupling circuit means for coupling said $V_{cc}$ input voltage terminal to the node between said capacitor and said first coupling circuit means whereby, when the output of said inverter buffer is low, said capacitor is charged from the voltage at said $V_{cc}$ terminal and through said second coupling means and, when said output of said inverter buffer is high, the voltage of said capacitor plus the voltage of said $V_{cc}$ terminal are applied in series through said first coupling means to said control terminal of said gate controlled MOS power semiconductor device; and wherein said first coupling means comprises a depletion mode MOSFET having source and drain terminals connected to said capacitor and to said control electrode of said gate controlled MOS power semiconductor device respectively, said depletion mode MOSFET having a substrate diode connected to the output of said inverter buffer; a resistive circuit means connected from said capacitor to the gate of said depletion mode MOSFET, and a second control MOSFET connected from said gate of said depletion mode MOSFET to said ground terminal and having a gate connected to said oscillator output terminal.

29. The circuit of claim 28 wherein said second coupling means is a diode.

30. The circuit of claim 28 wherein said resistive circuit means comprises a second depletion mode MOSFET having a gate connected to the gate of said first-mentioned depletion mode transistor and a substrate connected to the substrate of said first-mentioned depletion mode MOSFET.

31. The circuit of claim 10 wherein said second coupling circuit means includes a control MOSFET.

32. The circuit of claim 28 wherein said second coupling circuit means includes a control MOSFET.

* * * * *